United States Patent
Takase et al.

(10) Patent No.: US 10,523,227 B2
(45) Date of Patent: Dec. 31, 2019

(54) A/D CONVERTER AND SENSOR APPARATUS INCLUDING THE SAME

(71) Applicant: Murata Manufacturing Co., Ltd., Nagaokakyo-shi, Kyoto-fu (JP)

(72) Inventors: Yasuhide Takase, Nagaokakyo (JP); Yasuyuki Matsuya, Nagaokakyo (JP); Eri Mizukami, Nagaokakyo (JP); Yuji Inagaki, Nagaokakyo (JP); Kazuki Mizukami, Nagaokakyo (JP); Nozomi Watanabe, Nagaokakyo (JP); Riku Yonekawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/158,330

(22) Filed: Oct. 12, 2018

(65) Prior Publication Data
US 2019/0044527 A1 Feb. 7, 2019

Related U.S. Application Data

(63) Continuation of application No. PCT/JP2017/014534, filed on Apr. 7, 2017.

(30) Foreign Application Priority Data

Apr. 15, 2016 (JP) ................. 2016-082127

(51) Int. Cl.
| H03M 1/12 | (2006.01) |
| H03M 1/08 | (2006.01) |
| H03M 3/02 | (2006.01) |
| H03M 1/20 | (2006.01) |
| H03M 3/00 | (2006.01) |

(52) U.S. Cl.
CPC ......... *H03M 1/0854* (2013.01); *H03M 1/208* (2013.01); *H03M 3/02* (2013.01);
(Continued)

(58) Field of Classification Search
CPC .... H03M 1/0854; H03M 3/436; H03M 3/022; H03M 3/464; H03M 1/208; H03M 3/02;
(Continued)

(56) References Cited

U.S. PATENT DOCUMENTS

| 5,227,795 A | 7/1993 | Yamakido et al. |
| 6,002,352 A * | 12/1999 | El-Ghoroury ......... H03M 1/208 341/139 |

(Continued)

FOREIGN PATENT DOCUMENTS

| JP | 55-165027 A | 12/1980 |
| JP | 57-124933 A | 8/1982 |

(Continued)

OTHER PUBLICATIONS

Official Communication issued in International Patent Application No. PCT/JP2017/014534, dated Jun. 27, 2017.

*Primary Examiner* — Jean B Jeanglaude
(74) *Attorney, Agent, or Firm* — Keating & Bennett, LLP

(57) ABSTRACT

An A/D converter includes an adder that calculates a difference between an analog input signal and a predicted value, a quantizer that quantizes the difference output from the adder to convert the analog input signal to a digital signal, a prediction filter that generates a predicted value from the digital signal output from the quantizer, and a D/A converter that converts the predicted value from a digital signal to an analog signal and output the predicted value to the adder. The predicted value before being subjected to conversion to the analog signal by the D/A converter defines and functions as an A/D converted output of the analog input signal input to the adder.

18 Claims, 7 Drawing Sheets

(52) U.S. Cl.
CPC ............ *H03M 3/022* (2013.01); *H03M 3/436* (2013.01); *H03M 3/464* (2013.01); *H03M 3/496* (2013.01)

(58) Field of Classification Search
CPC ........ H03M 3/496; H03M 1/66; H03M 1/001; H03M 1/004; H03M 1/02; H03M 1/10; H03M 1/12; H03M 3/50
USPC .................................................. 341/155, 143
See application file for complete search history.

(56) References Cited

U.S. PATENT DOCUMENTS

| | | | | |
|---|---|---|---|---|
| 6,031,484 A | * | 2/2000 | Bullinger | .............. B60R 21/013 340/436 |
| 6,232,899 B1 | * | 5/2001 | Craven | ............... H03M 1/1038 341/126 |
| 8,009,072 B2 | * | 8/2011 | Rigby | ................... H03M 1/183 341/118 |
| 2003/0006921 A1 | * | 1/2003 | Stetson | ................. H03M 1/208 341/143 |
| 2010/0283648 A1 | | 11/2010 | Niwa et al. | |
| 2014/0368222 A1 | | 12/2014 | Curtis | |
| 2016/0269045 A1 | * | 9/2016 | Srinivasan | ............... H03M 3/37 |
| 2017/0187387 A1 | * | 6/2017 | Srinivasan | ............. H03M 3/37 |
| 2018/0262204 A1 | | 9/2018 | Takase et al. | |

FOREIGN PATENT DOCUMENTS

| | | | |
|---|---|---|---|
| JP | 03-110924 A | | 5/1991 |
| JP | H03110924 | * | 5/1991 |
| JP | 04-215319 A | | 8/1992 |
| JP | 2003-318736 A | | 11/2003 |
| JP | 2010-263483 A | | 11/2010 |
| WO | 2017086188 A1 | | 5/2017 |

\* cited by examiner

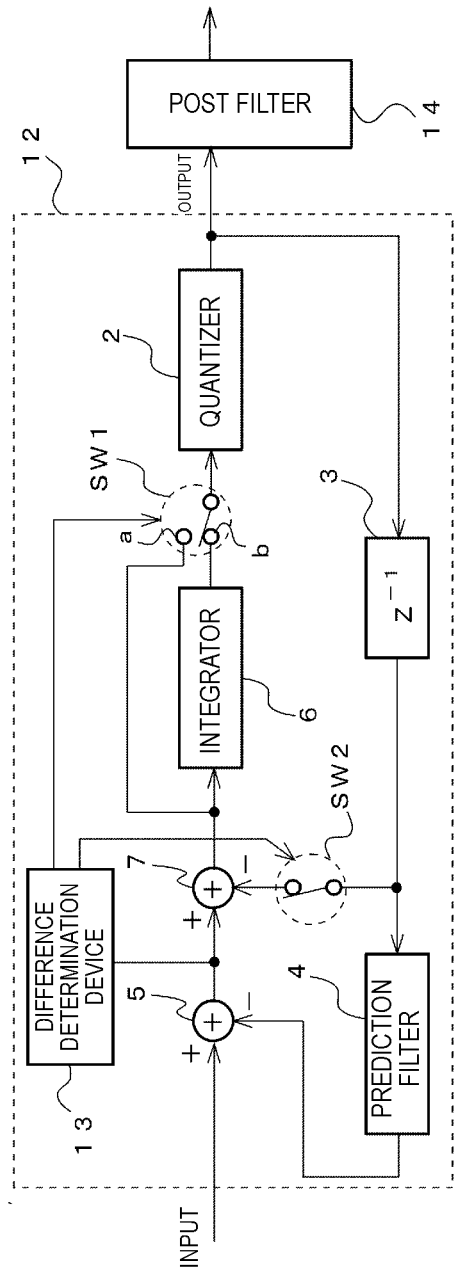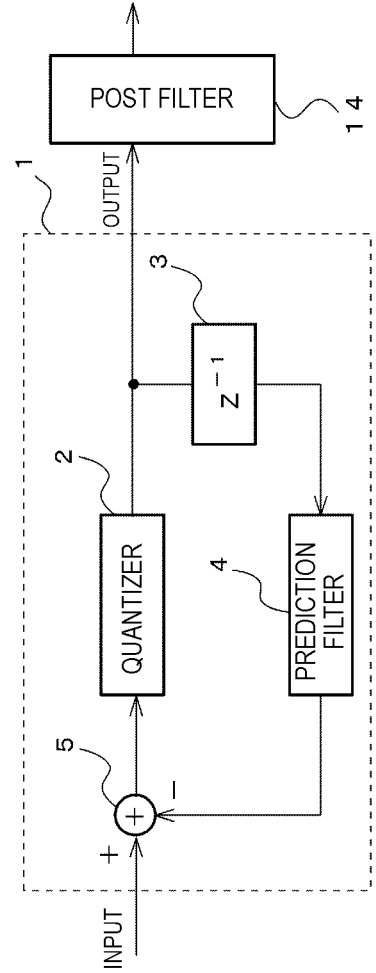
FIG. 1A
PRIOR ART
FIG. 1B
PRIOR ART

A/D CONVERTER AND SENSOR APPARATUS INCLUDING THE SAME

CROSS REFERENCE TO RELATED APPLICATIONS

This application claims the benefit of priority to Japanese Patent Application No. 2016-082127 filed on Apr. 15, 2016 and is a Continuation Application of PCT Application No. PCT/JP2017/014534 filed on Apr. 7, 2017. The entire contents of each application are hereby incorporated herein by reference.

BACKGROUND OF THE INVENTION

1. Field of the Invention

The present invention relates to an A/D converter that causes a quantizer to quantize a difference between an analog input signal and a predicted value output from a prediction filter to convert the analog input signal to a digital signal, and a sensor apparatus including the A/D converter.

2. Description of the Related Art

As this type of A/D converter, an oversampling A/D converter is disclosed in Japanese Unexamined Patent Application Publication No. 2003-318736, for example. This oversampling A/D converter is defined by a hybrid modulator 12 whose schematic configuration is illustrated in FIG. 1A. The hybrid modulator 12 uses both $\Delta$ (delta) modulation performed by a $\Delta$ modulator 1 illustrated in FIG. 1B and $\Delta\Sigma$ (delta sigma) modulation performed by a $\Delta\Sigma$ modulator. The $\Delta$ modulator 1 illustrated in FIG. 1B causes a delay device 3 to delay an output of a quantizer 2 by one sampling time, and causes a prediction filter 4 to integrate the output and to output, as a predicted value, the resultant output to an adder 5. At this time, the predicted value is converted to an analog signal by a D/A converter, which is not illustrated, and is output to the adder 5. The adder 5 outputs a difference between an input signal and the predicted value to the quantizer 2. The quantizer quantizes the input signal in accordance with a value of a threshold every time a sampling clock is input. The $\Delta\Sigma$ modulator has a configuration in which the prediction filter 4 and the adder 5 are removed from the hybrid modulator 12 illustrated in FIG. 1A. The $\Delta\Sigma$ modulator causes an adder 7 to calculate a difference between a signal obtained by causing the delay device 3 to delay an output of the quantizer 2 by one sampling time and an input signal. The difference is integrated in discrete time by an integrator 6 so as to be subjected to noise shaping so that a quantization noise spectrum increases in a high-frequency region, and is then quantized by the quantizer 2.

The hybrid modulator 12 causes the prediction filter 4 to integrate a signal obtained by causing the delay device 3 to delay an output of the quantizer 2 to generate a predicted value, and causes the adder 5 to calculate a difference between an input signal and the predicted value. Then, the $\Delta\Sigma$ modulation is performed on the difference. That is, the adder 7 takes a difference between a signal obtained by causing the delay device 3 to delay an output of the quantizer 2 and an output of the adder 5, and the difference is integrated by the integrator 6 and is quantized by the quantizer 2.

In the hybrid modulator 12 disclosed in Japanese Unexamined Patent Application Publication No. 2003-318736, when a difference determination device 13 detects that a difference output from the adder 5 has exceeded a threshold, a switch SW1 is switched to a terminal side to put a switch SW2 into an open state. Thus, the hybrid modulator 12 illustrated in FIG. 1A changes to the $\Delta$ modulator 1 illustrated in FIG. 1B. Even when an input signal with a large step that causes a slope overload on a $\Delta$ modulation unit is input, switching to the $\Delta$ modulator 1 is performed after one clock of an oversampling clock, and thus ringing does not occur.

The hybrid modulator 12 has the advantage of the $\Delta$ modulator 1 and the advantage of the $\Delta\Sigma$ modulator. The hybrid modulator 12 increases an input voltage range through $\Delta$ modulation, and also forces quantization noise to a high-frequency side through noise shaping in $\Delta\Sigma$ modulation to reduce quantization noise in a necessary signal band. An output of the hybrid modulator 12 is the derivative of an input, and thus, in the case in which the A/D converter is actually used, a post filter 14 for reproduction is necessary at a stage subsequent to the hybrid modulator 12 as illustrated in FIG. 1A. With respect to the output of the hybrid modulator 12 that have been integrated by the post filter 14, quantization noise outside the signal band is further isolated by a post filter, which is not illustrated.

Furthermore, as a $\Delta\Sigma$ modulator that performs noise shaping of quantization noise, a second-order low-pass $\Delta\Sigma$ modulator of a continuous time system is disclosed in Japanese Unexamined Patent Application Publication No. 2010-263483. In this $\Delta\Sigma$ modulator as well, quantization noise generated by a quantizer is subjected to noise shaping to be shifted to a high-frequency region, and a high SN ratio is obtained in a signal band.

In the existing A/D converter disclosed in Japanese Unexamined Patent Application Publication No. 2003-318736 defined by the hybrid modulator 12, the post filter 14 is necessary at a stage subsequent to the hybrid modulator 12 as described above. Furthermore, in the A/D converter defined by the $\Delta$ modulator 1 as well, an output is similarly the derivative of an input, and thus, the post filter 14 for reproduction is necessary at a stage subsequent to the $\Delta$ modulator 1 as illustrated in FIG. 1B. For this reason, in the existing A/D converter, the circuit size has been increased by the size of the post filter 14 for reproduction that is necessary.

Furthermore, in the existing A/D converter disclosed in Japanese Unexamined Patent Application Publication No. 2003-318736 and the $\Delta\Sigma$ modulator disclosed in Japanese Unexamined Patent Application Publication No. 2010-263483, quantization noise is shifted to a high-frequency region through noise shaping, and thus, a steep filter characteristic is demanded of a post filter necessary at a subsequent stage to isolate quantization noise outside a signal band. For this reason, in the existing A/D converter using noise shaping, the integrator 6 for noise shaping becomes necessary, and, in addition, the post filter has to be configured to have a steep filter characteristic, thereby resulting in an increase in circuit size.

Furthermore, in a sensor apparatus including the existing A/D converter disclosed in Japanese Unexamined Patent Application Publication No. 2003-318736, the input impedance of the adder 5 has to be substantially higher than the output impedance of an input signal source. For this reason, in the case in which a capacitive charge output element serves as the input signal source, the impedance of the charge output element itself is high, and thus, an impedance conversion circuit has to be provided between the charge output element and the adder 5. Furthermore, to detect an output of the capacitive charge output element, an amplifier becomes necessary for duplication and addition of electric charge in the integrator 6, and driving of the amplifier increases the power consumption of the A/D converter.

SUMMARY OF THE INVENTION

According to a preferred embodiment of the present invention, an A/D converter includes an adder that calculates a difference between an analog input signal and a predicted value; a quantizer that quantizes the difference output from the adder to convert the analog input signal to a digital signal; a prediction filter that generates a predicted value from the digital signal output from the quantizer; and a D/A converter that converts the predicted value from a digital signal to an analog signal and outputs the predicted value to the adder.

In the A/D converter, the predicted value before being subjected to conversion to the analog signal by the D/A converter defines and functions as an A/D converted output of the analog input signal input to the adder.

In this configuration, the predicted value, which is a digital value, before being subjected to analog conversion to be fed back to the adder by the prediction filter defines and functions as an A/D converted output of the analog input signal input to the adder. Thus, a post filter for reproduction does not have to be provided at a stage subsequent to a modulator output as in the related art, and the A/D converter enables a simplified circuit configuration to reduce the circuit size.

Such a prediction filter includes a series circuit including an integrator, an imperfect differentiator, and a delay device that are connected in series and cause a series-connected circuit including the integrator and the imperfect differentiator to generate the predicted value; a second delay device that delays the predicted value generated by the series-connected circuit; and a second adder that calculates a difference between a value obtained by multiplying an output of the second delay device by a coefficient not greater than one and an input of the prediction filter and outputs the difference to the series-connected circuit.

The series-connected circuit including the integrator and the imperfect differentiator may include two integrators and one imperfect differentiator that are connected in series, thus making the predicted value to be fed back to the adder by the prediction filter, that is, an A/D converted output of the analog input signal more accurate.

Furthermore, such a prediction filter may also include a second adder that calculates a difference between a value obtained by multiplying the predicted value generated by the prediction filter by a coefficient not greater than one and an input of the prediction filter; an integrator that integrates an output of the second adder; and a third adder that calculates a difference between a value obtained by multiplying the predicted value generated by the prediction filter by a coefficient not greater than one and an output of the integrator to generate the predicted value.

In this configuration, a fourth adder that calculates a difference between a value obtained by multiplying the predicted value generated by the prediction filter by a coefficient not greater than one and an output of the integrator; and a second integrator that integrates an output of the fourth adder may be provided. The third adder calculates a difference between a value obtained by multiplying the predicted value generated by the prediction filter by a coefficient not greater than one and an output of the second integrator to generate the predicted value, thus making the predicted value to be fed back to the adder by the prediction filter, that is, an A/D converted output of the analog input signal more accurate.

Furthermore, in a preferred embodiment of the present invention, at least one attenuator is included in a path through which an output of the quantizer is fed back to the adder via the prediction filter.

When Δ modulation is performed by the adder, the quantizer, the prediction filter, and the D/A converter, a frequency spectrum of quantization noise represents frequency distribution characteristics in which a power spectral density is flat and uniform regardless of frequency, and, in this configuration, quantization noise included in an output of the quantizer is attenuated by the attenuator in the feedback path. Thus, when the quantization noise is attenuated by the attenuator, the frequency distribution characteristics in which the quantization noise is uniform caused by Δ modulation represent frequency distribution characteristics in which the power spectral density is lower, flat, and uniform. For this reason, the predicted value to be fed back to the adder by the prediction filter, that is, an A/D converted output of the analog input signal is not subjected to noise shaping by an integrator, and the quantization noise is reduced in a signal band, thus enabling an improvement in a signal-to-quantization noise ratio (SQNR). Thus, an integrator necessary for noise shaping becomes unnecessary, and, in addition, a steep filter characteristic is not demanded of a post filter to reduce the quantization noise shifted to a high-frequency region through noise shaping. As a result, the A/D converter that enables an improvement in SQNR to perform A/D conversion may be reduced in size and provided.

Furthermore, in a preferred embodiment of the present invention, the delay device operates with a clock signal with a phase different from that of a clock signal for the quantizer.

In this configuration, after operation of the delay device based on a clock signal provided to the delay device, a time that elapses before the start of operation of the quantizer based on a clock signal with a different phase provided to the quantizer may be used as an output settling time of the D/A converter. This enables a settling time demanded of the D/A converter to be secured without increasing the circuit size, thus reducing the size of the A/D converter.

Furthermore, a preferred embodiment of the present invention provides a sensor apparatus in which the adder at an input of the A/D converter according to any of the preferred embodiments described above is defined by a capacitance adder including a series circuit including a capacitive charge output sensor and a capacitor, and in which a connection point between the capacitive charge output sensor and the capacitor is connected to an input of the quantizer.

In this configuration, the adder that calculates a difference between the analog input signal and the predicted value is defined by the capacitance adder including the series circuit including the capacitive charge output sensor that defines and functions as an input signal source and the capacitor, and a capacitance component included in the capacitive charge output sensor itself is used as a portion of capacitance defining the capacitance adder. For this reason, the capacitive charge output sensor defines a portion of the adder that calculates a difference between the analog input signal and the predicted value. Thus, an impedance conversion circuit does not have to be provided between the adder provided at the input of the A/D converter and the capacitive charge output sensor having high impedance that defines and functions as an input signal source as in the related art. Furthermore, an amplifier becomes unnecessary because the capacitance adder is defined by only a passive element, and thus, the sensor apparatus may be reduced in power consumption and size.

Furthermore, in a preferred embodiment of the present invention, the D/A converter includes a plurality of the capacitors connected in parallel and terminals on one side of the plurality of capacitors are connected to the connection point such that the connection point is common to the terminals and whose capacitance has a weight, and performs D/A conversion of a voltage value at the connection point to an analog voltage value corresponding to the predicted value by selecting voltages to be applied to terminals on another side of the respective capacitors.

In this configuration, the predicted value output from the prediction filter is converted from a digital value to an analog voltage value by selecting voltages to be applied to the respective capacitors defining the capacitance adder in accordance with the predicted value. This enables an analog addition operation of an analog signal voltage value output by the capacitive charge output sensor and the predicted value output from the prediction filter.

In preferred embodiments of the present invention, a post filter for reproduction does not have to be provided at a stage subsequent to a modulator output, and the A/D converters that each enable a simplified circuit configuration to reduce the circuit size may be provided. Furthermore, the sensor apparatuses in each of which an impedance conversion circuit does not have to be provided, in which an amplifier is unnecessary, and that is small in size and consumes low power may be provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1A is a circuit block diagram illustrating an existing A/D converter defined by a hybrid modulator using both Δ modulation and ΔΣ modulation, and FIG. 1B is a circuit block diagram illustrating the existing A/D converter constituted by a Δ modulator.

DETAILED DESCRIPTION OF THE PREFERRED EMBODIMENTS

A/D converters and sensor apparatuses including the A/D converters according to preferred embodiments of the present invention will be described with reference to the drawings.

Figure 2:
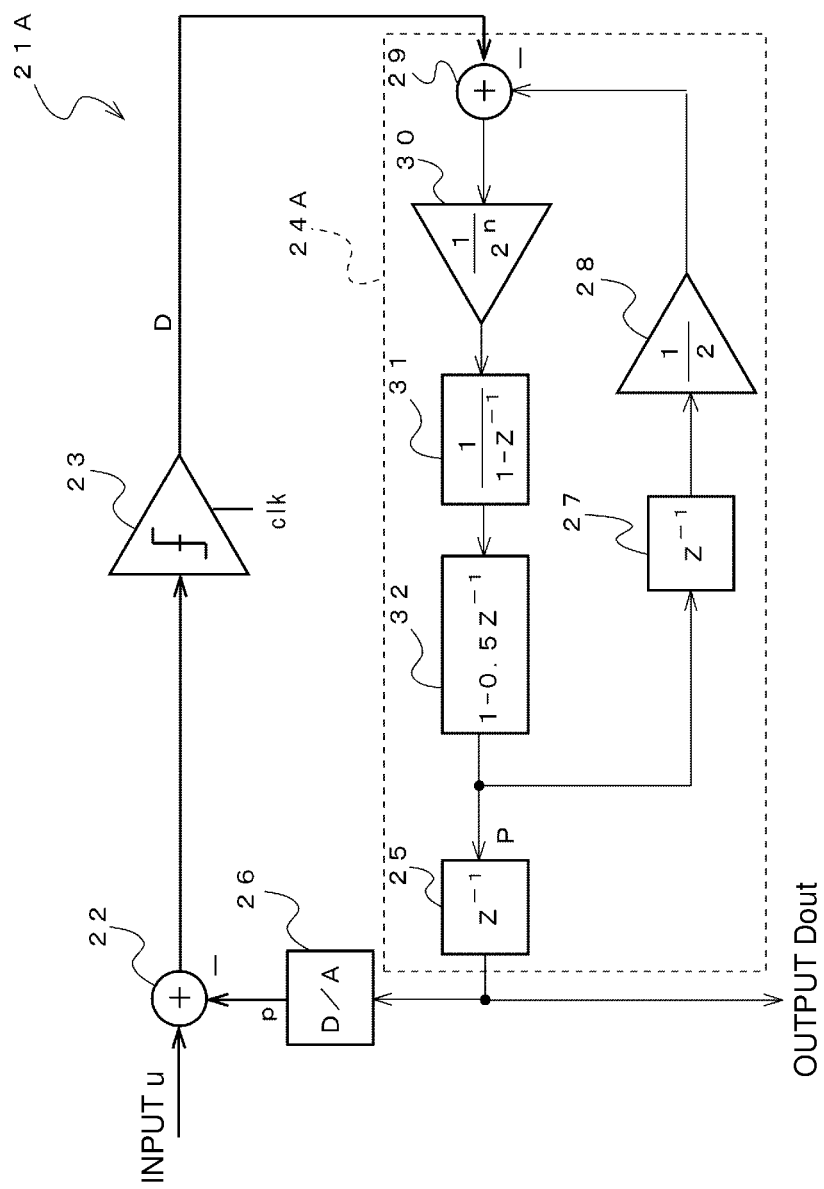
FIG. 2 is a circuit block diagram illustrating a schematic configuration of an A/D converter according to a first preferred embodiment of the present invention.

FIG. 2 is a circuit block diagram illustrating a schematic configuration of an A/D converter 21A according to a first preferred embodiment of the present invention.

The A/D converter 21A includes an adder 22, a quantizer 23, a prediction filter 24A, and a D/A converter 26. The adder 22 calculates a difference between an analog input signal u and a predicted value p. The quantizer 23 quantizes and encodes the difference output from the adder 22 to convert the analog input signal u to a digital signal D every time a sampling clock clk is input. The prediction filter 24A generates a predicted value P from the digital signal D output from the quantizer 23, and further causes a delay device 25 to delay the predicted value P to output the predicted value P. The D/A converter 26 converts the predicted value P from a digital signal to an analog signal that defines and functions as a predicted value p and outputs the predicted value p to the adder 22. In the A/D converter 21A, the predicted value P before being subjected to conversion to the analog signal by the D/A converter 26 defines and functions as an A/D converted output Dout of the analog input signal u input to the adder 22.

The prediction filter 24A in the A/D converter 21A according to the first preferred embodiment includes a second delay device 27, a multiplier 28, a second adder 29, an attenuator 30, and a series circuit including an integrator 31, an imperfect differentiator 32, and the delay device 25. An output of a series-connected circuit including the integrator 31 and the imperfect differentiator 32 is delayed by the second delay device 27 and is multiplied by a coefficient not greater than one, which is preferably, for example, a coefficient of about ½ in the present preferred embodiment, by the multiplier 28. The second adder 29 subtracts an output of the multiplier 28 from an input of the prediction filter 24A. The attenuator 30 is included in a path through which an output of the quantizer 23 is fed back to the adder 22 via the prediction filter 24A and preferably attenuates an output of the second adder 29 to about ½$^n$ (n is any value), for example. The series-connected circuit including the integrator 31 and the imperfect differentiator 32 deals with the output of the second adder 29 attenuated by the attenuator 30 as an input, and outputs a predicted value P obtained by integrating and differentiating the input to the delay device 25. The order in which the integrator 31 and the imperfect differentiator 32 in the above-described series-connected circuit are connected to each other may be reversed as compared to the illustrated order, and a position at which the attenuator 30 is disposed is any position in the feedback path.

In the A/D converter 21A according to the first preferred embodiment, the predicted value P, which is a digital value, before being subjected to analog conversion to be fed back to the adder 22 by the prediction filter 24A defines and functions as the A/D converted output Dout of the analog input signal u input to the adder 22. Thus, the post filter 14 for reproduction does not have to be provided at a stage subsequent to a modulator output as in the existing A/D converter illustrated in FIGS. 1A and 1B, and the A/D converter 21A that enables a simplified circuit configuration to reduce the circuit size is provided.

Furthermore, when Δ modulation is performed by the adder 22, the quantizer 23, the prediction filter 24A, and the D/A converter 26, a frequency spectrum of quantization noise Q represents frequency distribution characteristics in which a power spectral density is flat and uniform regardless of frequency, and, in this configuration, quantization noise Q included in an output of the quantizer 23 is attenuated by the attenuator 30 in the feedback path.

Thus, when the quantization noise Q is attenuated by the attenuator 30, the frequency distribution characteristics in which the quantization noise Q is uniform caused by Δ modulation represent frequency distribution characteristics in which the power spectral density is lower, flat, and uniform. For this reason, the predicted value P to be fed back to the adder 22 by the prediction filter 24A, that is, the A/D converted output Dout of the analog input signal u is not subjected to noise shaping by, for example, the integrator 6 in the A/D converter illustrated in FIG. 1A, and the quantization noise Q is reduced in a signal band, thus enabling an improvement in a signal-to-quantization noise ratio (SQNR). Thus, the integrator 6 or other component necessary for noise shaping becomes unnecessary, and, in addition, a steep filter characteristic is not demanded of a post filter to reduce the quantization noise Q shifted to a high-frequency region through noise shaping. As a result, the A/D converter 21A that enables an improvement in SQNR to perform A/D conversion is able to be reduced in size.

Figure 3:
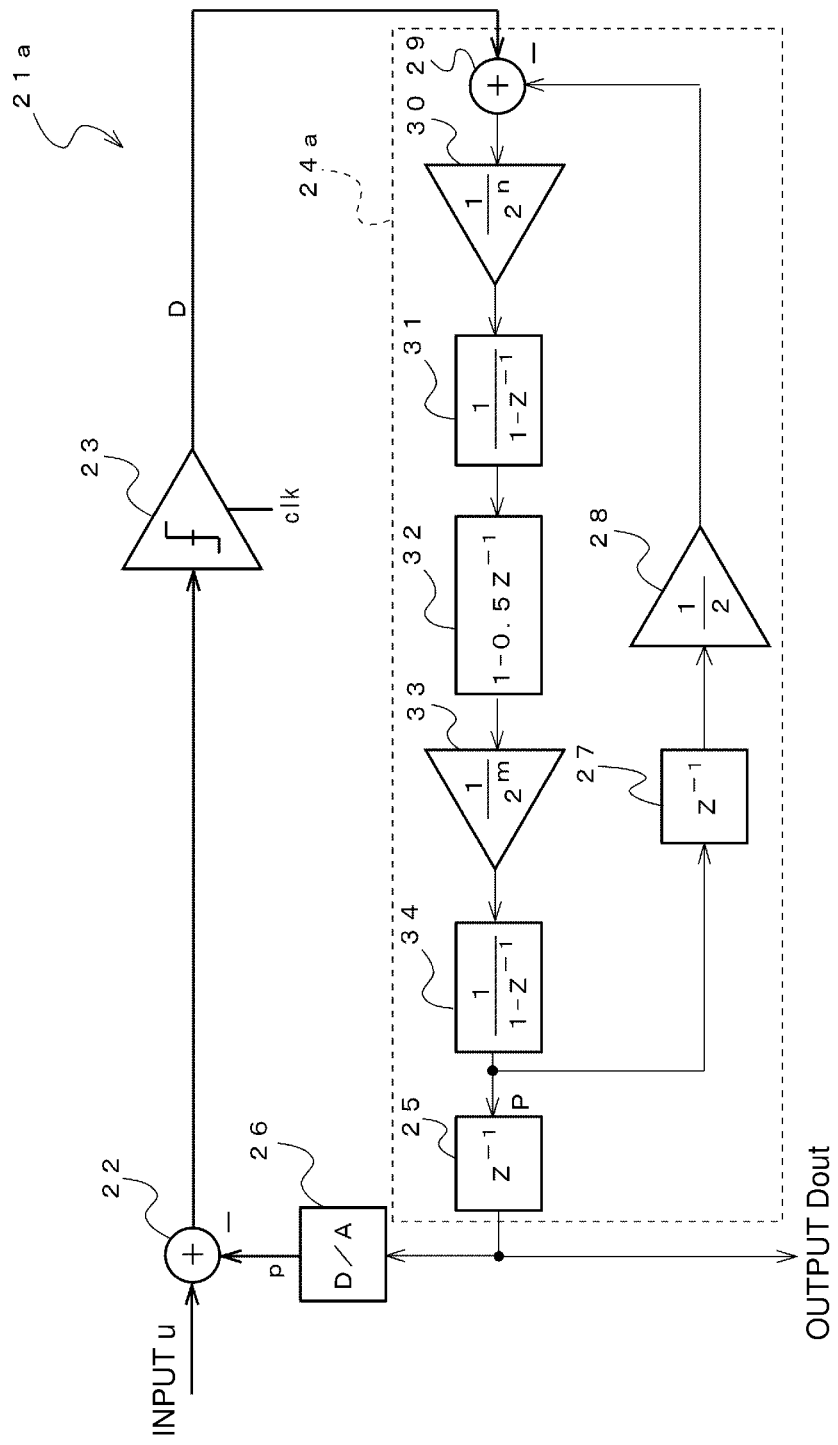
FIG. 3 is a circuit block diagram illustrating a schematic configuration of an A/D converter according to a modification of the first preferred embodiment of the present invention.

FIG. 3 is a circuit block diagram illustrating a schematic configuration of an A/D converter 21a according to a modification of the A/D converter 21A according to the first preferred embodiment. In FIG. 3, elements or portions that are the same as or correspond to those in FIG. 2 are denoted by the same reference signs, and descriptions thereof are omitted.

In the A/D converter 21a according to the modification, the configuration of a prediction filter 24a differs from that of the prediction filter 24A in the A/D converter 21A according to the first preferred embodiment, and the other configuration is the same or substantially the same as that in the A/D converter 21A according to the first preferred embodiment. The prediction filter 24a differs from the above-described prediction filter 24A in that a series-connected circuit is defined by two integrators 31 and 34 and one imperfect differentiator 32 that are connected in series, and in that two attenuators 30 and 33 are included in the path through which an output of the quantizer 23 is fed back to the adder 22 via the prediction filter 24a. The order in which the two integrators 31 and 34 and the one imperfect differentiator 32 in the series-connected circuit are connected is a random order. Furthermore, positions at which the attenuators 30 and 33 are disposed are any positions in the feedback path, and the number of attenuators only has to be at least one. The attenuator 33 preferably attenuates an input to about $1/2^m$ (m is any value), for example, to output the input.

The A/D converter 21a according to the modification achieves the same advantageous operational effects as the A/D converter 21A according to the first preferred embodiment. Furthermore, when the prediction filter 24a is configured as described above, the predicted value P to be fed back to the adder 22 by the prediction filter 24a, that is, the A/D converted output Dout of the analog input signal u is more accurate.

In the A/D converter 21A according to the first preferred embodiment and the A/D converter 21a according to the modification, the delay device 25 is not provided just in front of an output of each of the prediction filters 24A and 24a but may be provided between the quantizer 23 and an input of each of the prediction filters 24A and 24a. This configuration also achieves the same advantageous operational effects as the above-described preferred embodiment and modification.

Figure 4:
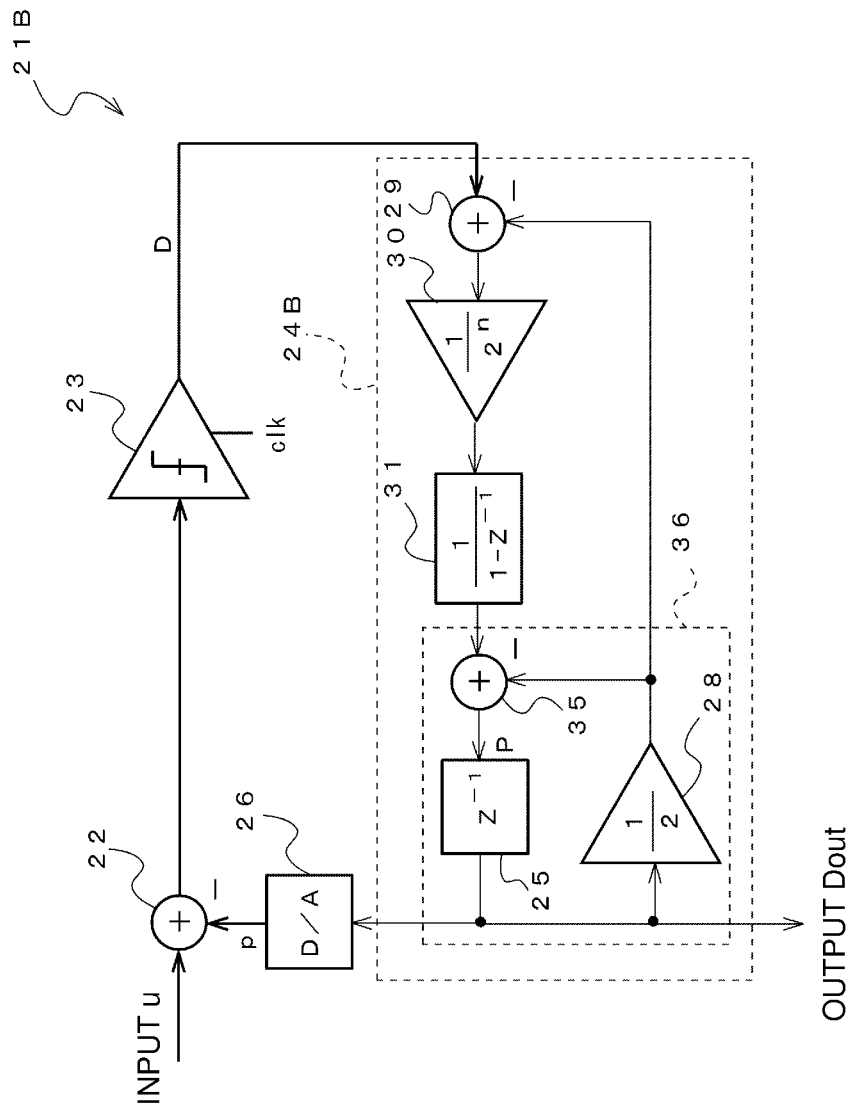
FIG. 4 is a circuit block diagram illustrating a schematic configuration of an A/D converter according to a second preferred embodiment of the present invention.

FIG. 4 is a circuit block diagram illustrating a schematic configuration of an A/D converter 21B according to a second preferred embodiment of the present invention. In FIG. 4, elements or portions that are the same as or correspond to those in FIG. 2 are denoted by the same reference signs, and descriptions thereof are omitted.

In the A/D converter 21B according to the second preferred embodiment, the configuration of a prediction filter 24B differs from that of the prediction filter 24A in the A/D converter 21A according to the first preferred embodiment. The other configuration is the same or substantially the same as that in the A/D converter 21A according to the first preferred embodiment, and the predicted value P before being subjected to conversion to an analog signal by the D/A converter 26 defines and functions as the A/D converted output Dout of the analog input signal u input to the adder 22.

The prediction filter 24B includes the delay device 25, the multiplier 28, the second adder 29, the attenuator 30, the integrator 31, and a third adder 35. The multiplier 28 multiplies the predicted value P generated by the prediction filter 24B and output from the delay device 25 by a coefficient not greater than one, which is preferably, for example, a coefficient of about ½ in the present preferred embodiment. The second adder 29 subtracts an output of the multiplier 28 from an input of the prediction filter 24B. The attenuator 30 is included in a path through which an output of the quantizer 23 is fed back to the adder 22 via the prediction filter 24B and preferably attenuates an output of the second adder 29 to about $1/2^n$, for example. The integrator 31 integrates the attenuated output of the second adder 29. The third adder 35 subtracts a value obtained by multiplying an output of the delay device 25 preferably, for example, by a coefficient of about ½, from an output of the integrator 31 to generate the predicted value P. The delay device 25, the multiplier 28, and the third adder 35 defines a differentiator 36.

The A/D converter 21B according to the second preferred embodiment also achieves the same advantageous operational effects as the A/D converter 21A according to the first preferred embodiment. The post filter 14 (see FIGS. 1A and 1B) for reproduction does not have to be provided as in the related art, and the A/D converter 21B that enables a simplified circuit configuration to reduce the circuit size is able to be provided. Furthermore, the integrator 6 or other component necessary for noise shaping becomes unnecessary, and, in addition, a steep filter characteristic is not demanded of a post filter. Thus, the A/D converter 21B that enables an improvement in SQNR to perform A/D conversion is able to be reduced in size.

Figure 5:
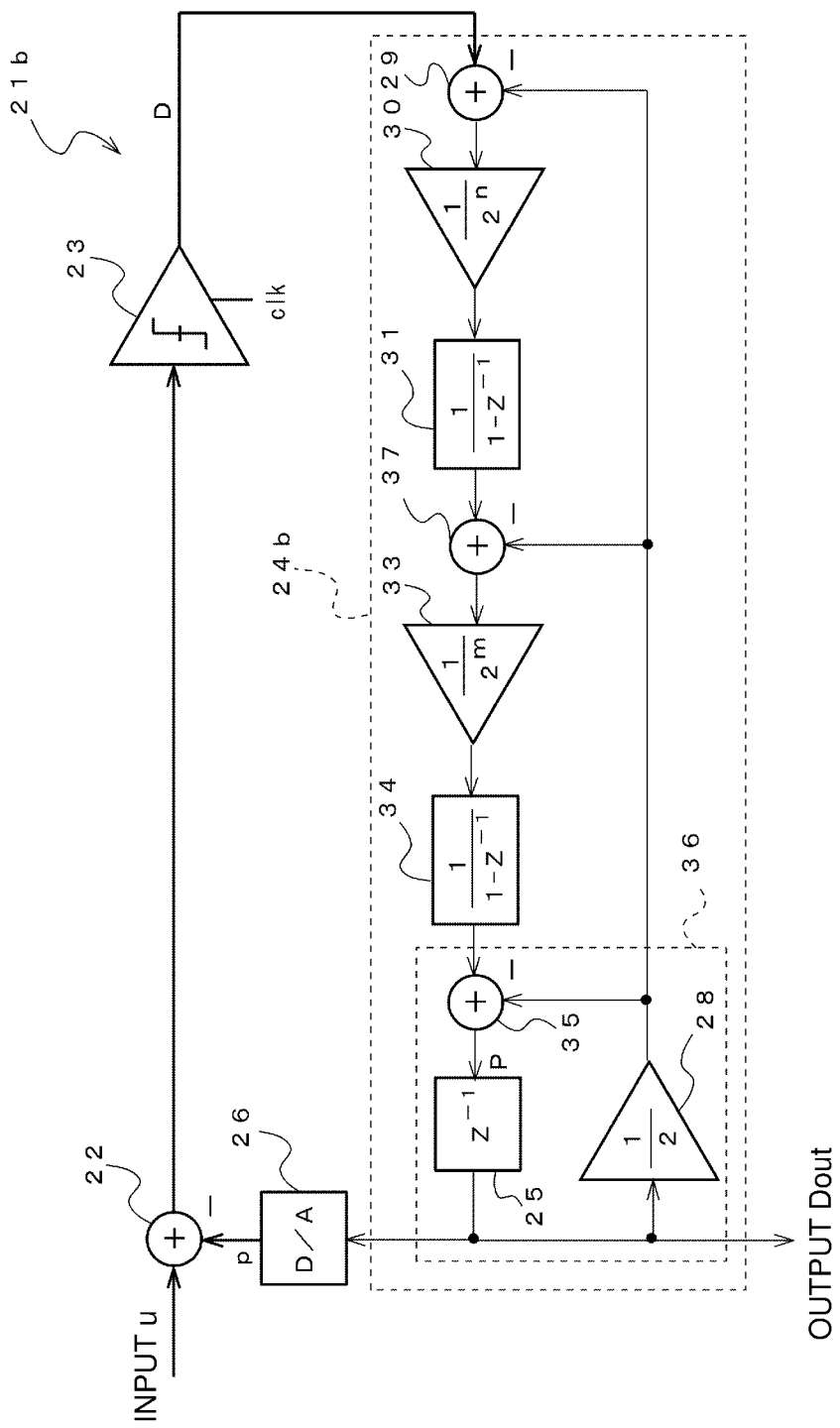
FIG. 5 is a circuit block diagram illustrating a schematic configuration of an A/D converter according to a modification of the second preferred embodiment of the present invention.

FIG. 5 is a circuit block diagram illustrating a schematic configuration of an A/D converter 21b according to a modification of the A/D converter 21B according to the second preferred embodiment. In FIG. 5, elements or portions that are the same as or correspond to those in FIG. 4 are denoted by the same reference signs, and descriptions thereof are omitted.

In the A/D converter 21b according to the modification, the configuration of a prediction filter 24b differs from that of the prediction filter 24B in the A/D converter 21B according to the second preferred embodiment, and the other configurations are the same as that in the A/D converter 21B according to the second preferred embodiment. The prediction filter 24b in the A/D converter 21b according to the modification includes a fourth adder 37 that subtracts an output of the multiplier 28, that is, a value obtained by multiplying the predicted value P generated by the prediction filter 24b preferably by a coefficient of about ½, for example, from an output of the integrator 31, the attenuator 33 that preferably attenuates an output of the fourth adder 37 to about $½^m$, for example, and the second integrator 34 that integrates the output of the fourth adder 37. The third adder 35 subtracts an output of the multiplier 28 from an output of the second integrator 34. Positions at which the attenuators 30 and 33 are disposed are any positions in the feedback path through which an output of the quantizer 23 is fed back to the adder 22, and the number of attenuators only has to be at least one.

The A/D converter 21b according to the modification achieves the same advantageous operational effects as the A/D converter 21B according to the second preferred embodiment. Furthermore, when the prediction filter 24b is configured as described above, the predicted value P to be fed back to the adder 22 by the prediction filter 24b, that is, the A/D converted output Dout of the analog input signal u is more accurate.

In the A/D converter 21B according to the second preferred embodiment and the A/D converter 21b according to the modification, an input of the D/A converter 26 defines and functions not as an output of the delay device 25 but as an input of the delay device 25. Furthermore, the delay device 25 may be provided between the quantizer 23 and an input of each of the prediction filters 24B and 24b. These configurations also achieve the same advantageous operational effects as the second preferred embodiment and the modification thereof.

Furthermore, in the A/D converter 21A according to the first preferred embodiment, the A/D converter 21a according to the modification of the first preferred embodiment, the A/D converter 21B according to the second preferred embodiment, and the A/D converter 21b according to the modification of the second preferred embodiment, each of the adder 22, the second adder 29, the third adder 35, and the fourth adder 37 subtracts, from one input, the other input as already described. However, it is only necessary to calculate a difference between one input and the other input. One input may be inverted in sign by another circuit element, such as an inverter, to be added to the other input. For example, an output of the quantizer 23 is inverted and input to each of the prediction filter 24A, 24a, 24B, and 24b, and the second adder 29 may perform addition instead of subtraction of an output of the multiplier 28.

Furthermore, in the A/D converter 21A according to the first preferred embodiment, the A/D converter 21a according to the modification of the first preferred embodiment, the A/D converter 21B according to the second preferred embodiment, and the A/D converter 21b according to the modification of the second preferred embodiment, the delay device 25 does not necessarily have to operate with a clock signal with the same phase as that of a clock signal for the quantizer 23, and may operate with a clock signal with a phase different from that of the clock signal for the quantizer 23. In this configuration, after operation of the delay device 25 based on a clock signal X provided to the delay device 25, a time that elapses before the start of operation of the quantizer 23 based on a clock signal Y with a different phase provided to the quantizer 23 may be used as an output settling time of the D/A converter 26. This enables a settling time demanded of the D/A converter 26 to be secured without increasing the circuit size, thus reducing the size of the A/D converters 21A, 21a, 21B, and 21b.

Figure 6:
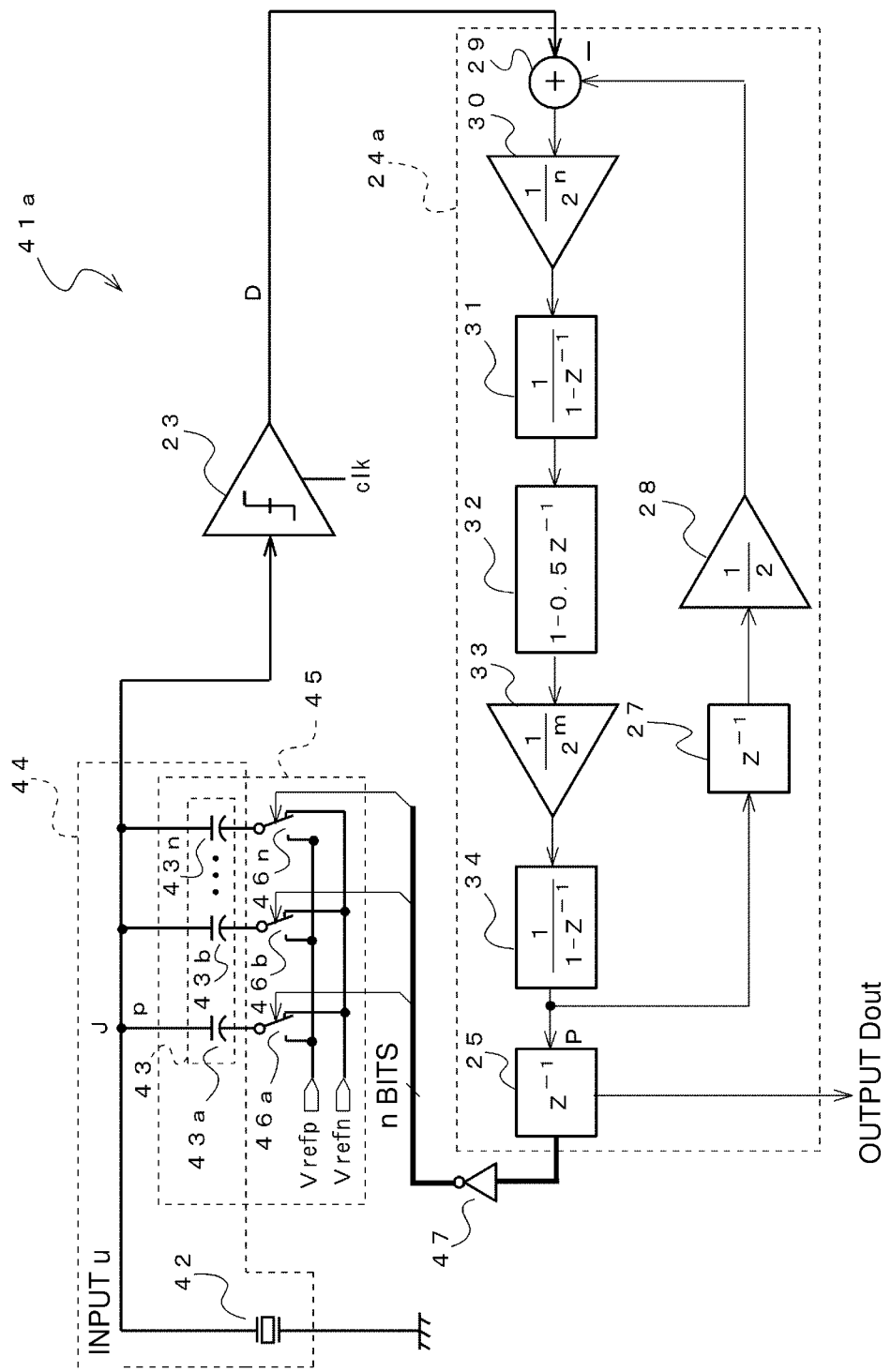
FIG. 6 is a circuit block diagram illustrating a schematic configuration of a sensor apparatus according to the first preferred embodiment of the present invention.

FIG. 6 is a circuit block diagram illustrating a schematic configuration of a sensor apparatus 41a according to a preferred embodiment of the present invention including the configuration of the A/D converter 21a illustrated in FIG. 3. In FIG. 6, elements or portions that are the same as or correspond to those in FIG. 3 are denoted by the same reference signs, and descriptions thereof are omitted.

The sensor apparatus 41a includes a capacitive charge output sensor 42, and converts the analog input signal u defined by an electric charge generated in the charge output element 42 to the digital signal D as in the A/D converter 21a. As such a capacitive charge output sensor 42, there are, for example, a pyroelectric infrared sensor that generates an electric charge by using the pyroelectric effect due to changes in element temperature, a piezoelectric ceramic pressure vibration shock sensor that generates an electric charge proportional to a stress by applying the stress to a piezoelectric element, and other suitable sensors.

A series circuit including the charge output sensor 42 and a capacitor 43 defines a capacitance adder 44, and a connection point J between the charge output element 42 and the capacitor 43 is connected to an input of the quantizer 23. The capacitor 43 includes a plurality of capacitors 43a, 43b, . . . , and 43n connected in parallel and including terminals on one side that are connected to the connection point J such that the connection point J is common to the terminals. The capacitance adder 44 calculates a difference between the analog input signal u generated in the charge output sensor 42 and the predicted value P output from the prediction filter 24a. At this time, the predicted value P, which is a digital value, output from the prediction filter 24a is converted to the predicted value p, which is an analog voltage value, by a D/A converter 45 including the capacitors 43a, 43b, . . . , and 43n and switches 46a, 46b, . . . , and 46n. The predicted value P is subjected to n-bit conversion, is inverted by an inverter 47 to calculate a difference, and is output to the D/A converter 45. The inverter 47 may be provided between the quantizer 23 and an input of the prediction filter 24a.

The predicted value p is obtained by the D/A converter 45 performing D/A conversion of a voltage value applied to the connection point J by the capacitor 43 to an analog voltage value corresponding to the digital predicted value P by selecting voltages to be applied to terminals on the other side of the capacitors 43a, 43b, . . . , and 43n. The switches 46a, 46b, . . . , and 46n are provided between the terminals on the other side of the capacitors 43a, 43b, . . . , and 43n and the inverter 47, and a Vrefp voltage or a Vrefn voltage is applied to the terminals on the other side, which is the side opposite to the connection point J, of the capacitors 43a, 43b, . . . , and 43n by switching of the switches 46a, 46b, . . . , and 46n. Preferably, the Vrefp voltage is set to, for example, 1 [V], and the Vrefn voltage is set to, for example, 0 [V]. Furthermore, capacitance values of the capacitors 43a, 43b, , and 43n are preferably set to values obtained by, for example, assigning a weight to $2^0 \times C$ [F], $2^1 \times C$ [F], . . . , and $2^n \times C$ [F]. Thus, when the D/A converter 45 controls switching states of the switches 46a, 46b, . . . , and 46n in accordance with the predicted value P, which is a digital value, calculated by the prediction filter 24a, voltages to be applied to the capacitors 43a, 43b, . . . , and 43n are selected so that a combined voltage value of the capacitors 43a, 43b, . . . , and 43n becomes an analog voltage value corresponding to the predicted value P.

In the sensor apparatus 41a according to the present preferred embodiment, the predicted value P output from the prediction filter 24a is converted from a digital value to the predicted value p, which is an analog voltage value, by the D/A converter 45 selecting voltages to be applied to the capacitors 43a, 43b, ..., and 43n defining the capacitance adder 44 in accordance with the predicted value P. This enables an analog addition operation of a voltage value of the analog input signal u output by the capacitive charge output element 42 and the predicted value p output from the prediction filter 24a.

Furthermore, in the sensor apparatus 41a according to the present preferred embodiment, the adder that calculates a difference between the analog input signal u and the predicted value p is defined by the capacitance adder 44 including the series circuit including the capacitive charge output sensor 42 defining and functioning as an input signal source and the capacitor 43, and a capacitance component included in the capacitive charge output sensor 42 itself is used as a portion of capacitance defining the capacitance adder 44. For this reason, the capacitive charge output sensor 42 defines a portion of the adder that calculates a difference between the analog input signal u and the predicted value p. Thus, an impedance conversion circuit does not have to be provided between the adder provided at an input of the A/D converter and the capacitive charge output element 42 having high impedance that defines and functions as an input signal source as in the related art. Furthermore, an amplifier becomes unnecessary because the capacitance adder 44 is defined by only a passive element, and thus, the sensor apparatus 41a may be reduced in power consumption and size.

In the sensor apparatus 41a, the prediction filter 24A illustrated in FIG. 2 may be used in place of the prediction filter 24a, and thus, the sensor apparatus 41a may have the configuration of the A/D converter 21A. The sensor apparatus 41a having such a configuration also achieves the same advantageous operational effects.

Figure 7:
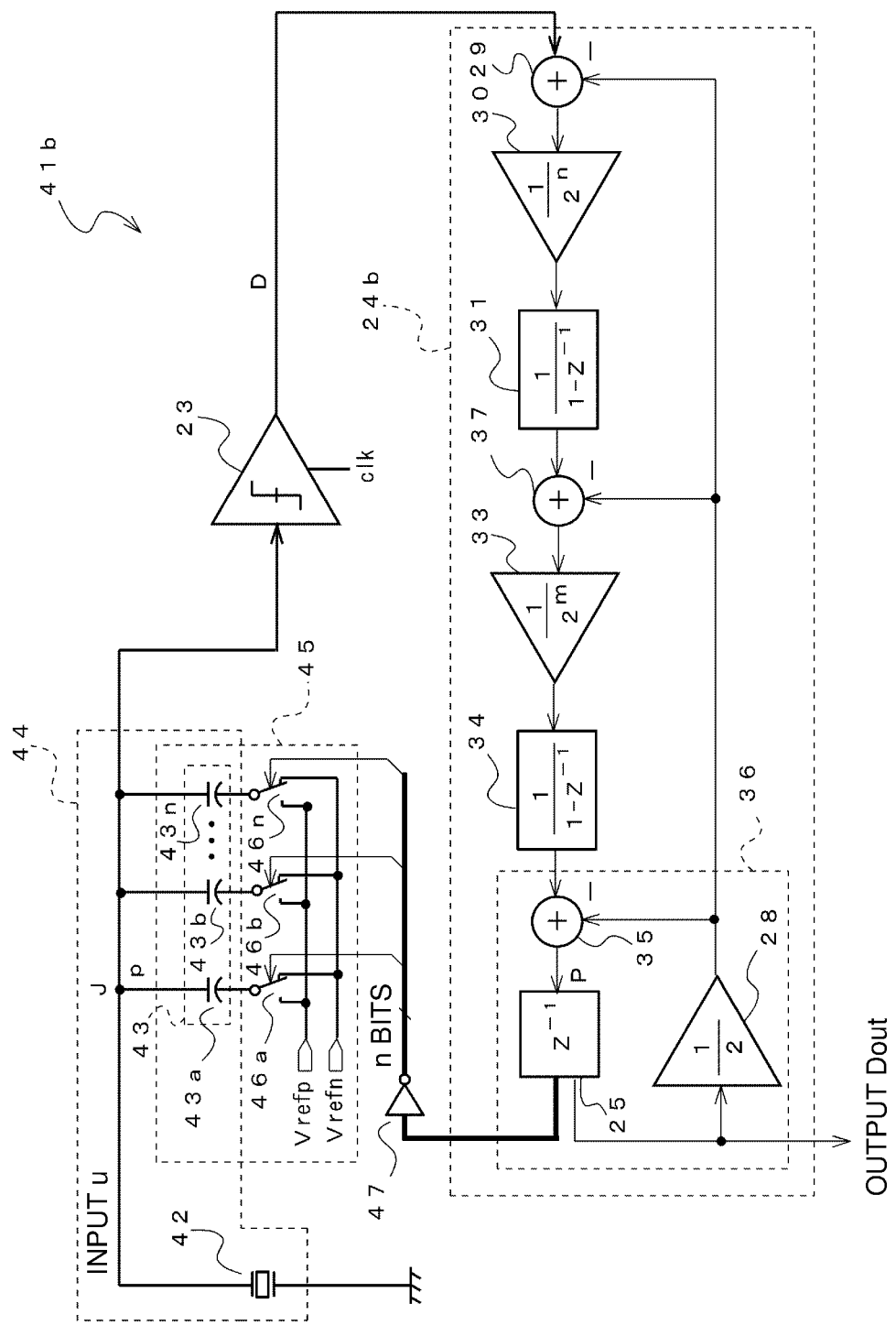
FIG. 7 is a circuit block diagram illustrating a schematic configuration of a sensor apparatus according to the second preferred embodiment of the present invention.

FIG. 7 is a circuit block diagram illustrating a schematic configuration of a sensor apparatus 41b according to a preferred embodiment of the present invention. In FIG. 7, elements or portions that are the same as or correspond to those in FIGS. 5 and 6 are denoted by the same reference signs, and descriptions thereof are omitted.

The sensor apparatus 41b according to the present preferred embodiment differs from the sensor apparatus 41a according to the above-described preferred embodiment only in that the sensor apparatus 41b has the configuration of the A/D converter 21b illustrated in FIG. 5. That is, the prediction filter 24b is provided in place of the prediction filter 24a. The other configurations are the same or substantially the same as that in the sensor apparatus 41a according to the first preferred embodiment.

The sensor apparatus 41b according to the present preferred embodiment also achieves the same advantageous operational effects as the sensor apparatus 41a according to the above-described preferred embodiment, thus enabling an analog addition operation of a voltage value of the analog input signal u output by the capacitive charge output element 42 and the predicted value p output from the prediction filter 24b. Furthermore, an impedance conversion circuit does not have to be provided between the adder provided at an input of the A/D converter and the capacitive charge output element 42 having high impedance that defines and functions as an input signal source as in the related art. Additionally, an amplifier is unnecessary because the capacitance adder 44 is defined by only a passive element, and thus, the sensor apparatus 41b may be reduced in power consumption and size.

In the sensor apparatus 41b, the prediction filter 24B illustrated in FIG. 4 may be used in place of the prediction filter 24b, and thus, the sensor apparatus 41b may have the configuration of the A/D converter 21B. The sensor apparatus 41b having such a configuration also achieves the same advantageous operational effects.

The sensor apparatuses 41a and 41b according to the above-described preferred embodiments and modifications are preferably used as potion sensors, for example, in the case in which the capacitive charge output sensor 42 is a pyroelectric infrared sensor, and are preferably used as measurement sensors to measure pressure, vibration, and shock in various situations in industrial fields in the case in which the capacitive charge output sensor 42 is a pressure vibration shock sensor.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An A/D converter comprising:
   an adder that calculates a difference between an analog input signal and a predicted value;
   a quantizer that quantizes the difference output from the adder to convert the analog input signal to a digital signal;
   a prediction filter that generates a predicted value from the digital signal output from the quantizer; and
   a D/A converter that converts the predicted value from a digital signal to an analog signal and output the predicted value to the adder; wherein
   the predicted value before being subjected to conversion to the analog signal by the D/A converter defines and functions as an A/D converted output of the analog input signal input to the adder; and
   the prediction filter includes:
   a series circuit including an integrator, an imperfect differentiator, and a delay that are connected in series and cause a series-connected circuit including the integrator and the imperfect differentiator to generate the predicted value;
   a second delay that delays the predicted value generated by the series-connected circuit; and
   a second adder that calculates a difference between a value obtained by multiplying an output of the second delay by a coefficient not greater than one and an input of the prediction filter and output the difference to the series-connected circuit.

2. The A/D converter according to claim 1, wherein the delay operates with a clock signal with a phase different from that of a clock signal for the quantizer.

3. The A/D converter according to claim 1, wherein the coefficient is about ½.

4. The A/D converter according to claim 1, wherein the series-connected circuit includes two of the integrators and one of the imperfect differentiator that are connected in series.

5. The A/D converter according to claim 1, further comprising at least one attenuator in a path through which an output of the quantizer is fed back to the adder via the prediction filter.

6. An A/D converter comprising:
   an adder that calculates a difference between an analog input signal and a predicted value;

a quantizer that quantizes the difference output from the adder to convert the analog input signal to a digital signal;

a prediction filter that generates a predicted value from the digital signal output from the quantizer; and a D/A converter that converts the predicted value from a digital signal to an analog signal and output the predicted value to the adder; wherein the predicted value before being subjected to conversion to the analog signal by the D/A converter defines and functions as an A/D converted output of the analog input signal input to the adder; and the prediction filter includes:
 a second adder that calculates a difference between a value obtained by multiplying the predicted value generated by the prediction filter by a first coefficient not greater than one and an input of the prediction filter;
 an integrator that integrates an output of the second adder; and
 a third adder that calculates a difference between a value obtained by multiplying the predicted value generated by the prediction filter by a second coefficient not greater than one and an output of the integrator to generate the predicted value.

7. The A/D converter according to claim 6, further comprising:
 a fourth adder that calculates a difference between a value obtained by multiplying the predicted value generated by the prediction filter by a third coefficient not greater than one and an output of the integrator; and
 a second integrator that integrates an output of the fourth adder; wherein
 the third adder calculates a difference between a value obtained by multiplying the predicted value generated by the prediction filter by a fourth coefficient not greater than one and an output of the second integrator to generate the predicted value.

8. The A/D converter according to claim 6, wherein the first and second coefficients are about ½.

9. A sensor apparatus comprising:
 an A/D converter including:
  an adder that calculates a difference between an analog input signal and a predicted value;
  a quantizer that quantizer the difference output from the adder to convert the analog input signal to a digital signal;
  a prediction filter that generates a predicted value from the digital signal output from the quantizer; and
  a D/A converter that converts the predicted value from a digital signal to an analog signal and output the predicted value to the adder; wherein
 the predicted value before being subjected to conversion to the analog signal by the D/A converter defines and functions as an A/D converted output of the analog input signal input to the adder;
 the adder is a capacitance adder including a series circuit including a capacitive charge output sensor and a capacitor; and
 a connection point between the capacitive charge output sensor and the capacitor is connected to an input of the quantizer.

10. The sensor apparatus according to claim 9, further comprising at least one attenuator in a path through which an output of the quantizer is fed back to the adder via the prediction filter.

11. The sensor apparatus according to claim 9, wherein the D/A converter includes:
 a plurality of the capacitors connected in parallel; wherein
 the plurality of capacitors include terminals on one side that are connected to the connection point such that the connection point is common to the terminals and a capacitance thereof has a weight; and
 the D/A converter performs D/A conversion of a voltage value at the connection point to an analog voltage value corresponding to the predicted value by selecting voltages to be applied to terminals on another side of the respective capacitors.

12. The sensor apparatus according to claim 9, wherein the prediction filter includes:
 a series circuit including an integrator, an imperfect differentiator, and a delay that are connected in series and cause a series-connected circuit including the integrator and the imperfect differentiator to generate the predicted value;
 a second delay that delays the predicted value generated by the series-connected circuit; and
 a second adder that calculates a difference between a value obtained by multiplying an output of the second delay by a coefficient not greater than one and an input of the prediction filter and output the difference to the series-connected circuit.

13. The sensor apparatus according to claim 12, wherein the coefficient is about ½.

14. The sensor apparatus according to claim 12, wherein the series-connected circuit includes two of the integrators and one of the imperfect differentiator that are connected in series.

15. The sensor apparatus according to claim 12, wherein the delay operates with a clock signal with a phase different from that of a clock signal for the quantizer.

16. The sensor apparatus according to claim 9, wherein the prediction filter includes:
 a second adder that calculates a difference between a value obtained by multiplying the predicted value generated by the prediction filter by a first coefficient not greater than one and an input of the prediction filter;
 an integrator that integrates an output of the second adder; and
 a third adder that calculates a difference between a value obtained by multiplying the predicted value generated by the prediction filter by a second coefficient not greater than one and an output of the integrator to generate the predicted value.

17. The sensor apparatus according to claim 16, further comprising:
 a fourth adder that calculates a difference between a value obtained by multiplying the predicted value generated by the prediction filter by a third coefficient not greater than one and an output of the integrator; and
 a second integrator that integrates an output of the fourth adder; wherein
 the third adder calculates a difference between a value obtained by multiplying the predicted value generated by the prediction filter by a fourth coefficient not greater than one and an output of the second integrator to generate the predicted value.

18. The sensor apparatus according to claim 16, wherein the first and second coefficients are about ½.

* * * * *